(12) United States Patent
Buehler

(10) Patent No.: US 9,690,646 B2
(45) Date of Patent: Jun. 27, 2017

(54) ROBUST SERDES WRAPPER

(71) Applicant: SEAKR ENGINEERING, INC., Centennial, CO (US)

(72) Inventor: Erik Buehler, Castle Rock, CO (US)

(73) Assignee: SEAKR ENGINEERING, INC., Centennial, CO (US)

( * ) Notice: Subject to any disclaimer, the term of this patent is extended or adjusted under 35 U.S.C. 154(b) by 77 days.

(21) Appl. No.: 14/812,871

(22) Filed: Jul. 29, 2015

(65) Prior Publication Data
US 2016/0188395 A1 Jun. 30, 2016

Related U.S. Application Data

(60) Provisional application No. 62/030,529, filed on Jul. 29, 2014.

(51) Int. Cl.
| | | |
|---|---|---|
| *H04L 1/00* | (2006.01) | |
| *G06F 11/07* | (2006.01) | |
| *H03M 9/00* | (2006.01) | |
| *H03M 13/03* | (2006.01) | |
| *H04L 1/16* | (2006.01) | |
| *H04L 1/22* | (2006.01) | |

(52) U.S. Cl.
CPC ........ *G06F 11/079* (2013.01); *G06F 11/0706* (2013.01); *G06F 11/0751* (2013.01); *H03M 9/00* (2013.01); *H03M 13/03* (2013.01); *H04L 1/0045* (2013.01); *H04L 1/0061* (2013.01); *H04L 1/16* (2013.01); *H04L 1/22* (2013.01)

(58) Field of Classification Search
CPC ...................................... H04L 1/0057

USPC ................................ 714/776, 708, 807, 751
See application file for complete search history.

(56) References Cited

U.S. PATENT DOCUMENTS

| | | | |
|---|---|---|---|
| 6,157,210 A | 12/2000 | Zaveri et al. | |
| 6,990,538 B2 | 1/2006 | Rojas et al. | |
| 7,191,371 B2 | 3/2007 | Hsu et al. | |
| 7,290,238 B2 | 10/2007 | Stauffer et al. | |
| 7,363,402 B2 * | 4/2008 | Lesartre ............... | G06F 13/4282 710/36 |
| 7,414,429 B1 | 8/2008 | Kim et al. | |
| 7,424,566 B2 | 9/2008 | Manula et al. | |
| 7,603,579 B2 | 10/2009 | Furuya | |
| 7,716,398 B2 | 5/2010 | Brown | |
| 7,742,427 B2 | 6/2010 | Farmer et al. | |

(Continued)

FOREIGN PATENT DOCUMENTS

GB      2500969 A     10/2013

OTHER PUBLICATIONS

International Search Report for International Application No. PCT/US2015/042719, dated Nov. 27, 2015.

(Continued)

*Primary Examiner* — Fritz Alphonse
(74) *Attorney, Agent, or Firm* — Robert G. Crouch; Marsh Fischmann & Breyfogle LLP

(57) ABSTRACT

Light-weight, configurable error detection in a satellite communication system that detects invalid SerDes lanes via hash codes appended to packets of data in the lanes. An indication can be passed back upstream about the invalid lane so that the lane can be reset. Error correction can be provided by reconstructing the bit data in the invalid SerDes lane based on parity information in an optional parity lane.

21 Claims, 4 Drawing Sheets

(56) References Cited

U.S. PATENT DOCUMENTS

| | | |
|---|---|---|
| 7,757,198 B1 | 7/2010 | Zhao et al. |
| 7,831,653 B2 | 11/2010 | Nation et al. |
| 7,958,285 B1 | 6/2011 | Chiu et al. |
| 8,135,558 B2 | 3/2012 | Kampf et al. |
| 8,225,156 B1 | 7/2012 | Tabatabaei et al. |
| 8,274,971 B2 | 9/2012 | Battle et al. |
| 8,582,705 B2 | 11/2013 | Frankel et al. |
| 8,694,951 B1 | 4/2014 | Prasanna et al. |
| 8,711,888 B2 | 4/2014 | Bar-Sade et al. |
| 8,832,336 B2 | 9/2014 | Morrison et al. |
| 2004/0028164 A1 | 2/2004 | Jiang et al. |
| 2005/0111845 A1 | 5/2005 | Nelson et al. |
| 2005/0198492 A1 | 9/2005 | Gaur et al. |
| 2009/0092064 A1 | 4/2009 | Fan et al. |
| 2010/0185926 A1 | 7/2010 | Lawson et al. |
| 2011/0072970 A1* | 3/2011 | Slobodzian ............ A61B 8/546 95/249 |
| 2012/0216084 A1* | 8/2012 | Chun ..................... H04L 25/02 714/708 |
| 2013/0036336 A1 | 2/2013 | Kitamura |
| 2014/0103959 A1 | 4/2014 | Andreev et al. |
| 2014/0108879 A1* | 4/2014 | Hirth .................. H03M 13/015 714/751 |
| 2014/0167818 A1 | 6/2014 | Eisenstadt |

OTHER PUBLICATIONS

Neogi et al, "Design of a 250-Gbit/s SiGe HBT Electrooptic Modulator," IEEE Photonics Journal, vol. 3, Issue: 5, Publication Year: 2011, pp. 897-914.

Kimura et al, "A 28 Gb/s 560 mW Multi-Standard SerDes With Single-Stage Analog Front-End and 14-Tap Decision Feedback Equalizer in 28 nm CMOS," IEEE Journal of Solid-State Circuits, vol. PP, Issue: 99, Publication Year: 2014, pp. 1-13.

Hoffman, John, "A Dynamically Reconfigurable Parallel Processing Framework with Application to High-Performance Video Processing," (2013).

Cole, Chris, et al., "100GbE-Optical LAN Technologies [Applications & Practice]," Communications Magazine, IEEE 45.12 (2007): 12-19.

\* cited by examiner

ROBUST SERDES WRAPPER

CROSS REFERENCE TO RELATED APPLICATIONS

This application claims priority from U.S. Provisional Patent Application No. 62/030,529, filed Jul. 29, 2014, which is hereby incorporated by reference in its entirety.

BACKGROUND

High speed electronic communications, such as telecommunication data being transmitted via a satellite, often include converting data in parallel format to data in serial format (referred to as serialization) and subsequently converting data in serial format to data in parallel format (referred to as deserialization). A device that performs this serialization and/or deserialization is referred to as a serializer/deserializer, or more commonly a SerDes.

The harsh environment faced by a satellite can increase the challenge of a SerDes design for satellite applications. One of the primary environmental risks in a satellite application is associated with the ionizing radiation environment present in space. It should be noted that radiation effects associated with ionizing radiation are also present in terrestrial applications, though the rate of occurrence in terrestrial applications is significantly lower than in space applications. The ionizing radiation environment includes heavy ions, protons, and neutrons which can impact the normal operation of semiconductor via single event effects (SEE), total ionizing dose (TID), and/or displacement damage dose (DDD). The effects of TID and DDD are generally cumulative over the mission duration and impact semiconductor parameters including current leakage. The effects of SEE are generally instantaneous and can impact the operation of the semiconductor circuit. These SEE effects include single event latchup (SEL), single event upset (SEU), single event transient (SET), and single event functional interrupt (SEFI). Mitigation for SEL can be provided via use of a technology such as silicon on insulator (SOI). The effects of SEU, SET, and/or SEFI can include causing a SerDes communication line (commonly referred to as a lane) to go into an invalid state (an example would be loss of lock) in which valid data is no longer being transmitted or received for an extended period of time. The loss of valid data for an extended period of time (an example is a time period greater than −10 to −100 microseconds) can result in a considerable amount of data being lost, especially for high speed SerDes lanes operating at high speeds (examples of which are in the range 3.125 to 22+Gbps). The typical mitigation for such effects is to re-initialize, power cycle, or otherwise reset the SerDes lane. This can take an undesirable amount of time to detect and remedy the problem, and data can be lost in the meantime. In some applications, the rapid detection and resetting of a non-functional SerDes communication lane is tolerable, while other applications have very little allowance for even small losses of data, requiring a more robust approach that minimizes or avoids such issues.

It is against this background that the techniques disclosed herein have been developed.

SUMMARY

Disclosed herein is a device, including a pair of serializer/deserializers with a serial communication line therebetween, that together include a SerDes lane; and an error detection system associated with the SerDes lane, the error detection system detecting when the SerDes lane is invalid, wherein the error detection system includes determining a hash code of a packet of data in the SerDes lane at a transmit side of the SerDes lane, sending the determined hash code along with the associated packet of data to a receive side of the SerDes lane, calculating a hash code of the received packet of data in the SerDes lane at the receive side of the SerDes lane, and comparing the calculated hash code to the sent hash code and determining the presence or absence of errors based on the comparison.

The error detection system may receive an input from a loss-of-lock indicator provided by the SerDes macro and uses that indicator to help determined when the SerDes lane is invalid. The error detection system may be configurable to allow for a user to optionally select or deselect a parity lane to be associated with one or more SerDes lanes, in order to provide parity information from which data in a SerDes lane determined to be invalid can be reconstructed. The device may be configurable to allow for a user to optionally select or deselect for the error detection system to be operational. The device may be configurable to allow for a user to optionally select or deselect for a determination that the SerDes lane is invalid to be communicated from the receive side of the SerDes lane to the transmit side of the SerDes lane. The device may be configurable to allow for a user to optionally select or deselect for the transmit side of the SerDes lane to reset the SerDes lane upon receiving a communication from the receive side of the SerDes lane that the SerDes lane is invalid. The device further includes an error correction system associated with the SerDes lane to reconstruct data in the SerDes lane when it is determined that the SerDes lane is invalid. The error correction system may include a parity lane associated with one or more SerDes lanes, the parity lane including parity information based on the Exclusive OR state of the bits in the one or more SerDes lanes. The parity information may be used to reconstruct bits in a SerDes lane that has been determined to be invalid. The device may further include a communication link to provide information about the invalid SerDes lane from the receive side to the transmit side. The determined hash code and the calculated hash code may each include the Exclusive OR product of the packet of data.

Also disclosed is a device resident in a communications satellite that includes a pair of serializer/deserializers with a serial communication line therebetween, that together include a SerDes lane in the communications satellite; and an error detection system in the communications satellite, the error detection system associated with the SerDes lane, the error detection system detecting when the SerDes lane is invalid, wherein the error detection system includes determining a hash code of a packet of data in the SerDes lane at a transmit side of the SerDes lane, sending the determined hash code along with the associated packet of data to a receive side of the SerDes lane, calculating a hash code of the received packet of data in the SerDes lane at the receive side of the SerDes lane, and comparing the calculated hash code to the sent hash code and determining the presence or absence of errors based on the comparison.

DETAILED DESCRIPTION

Figure 1:
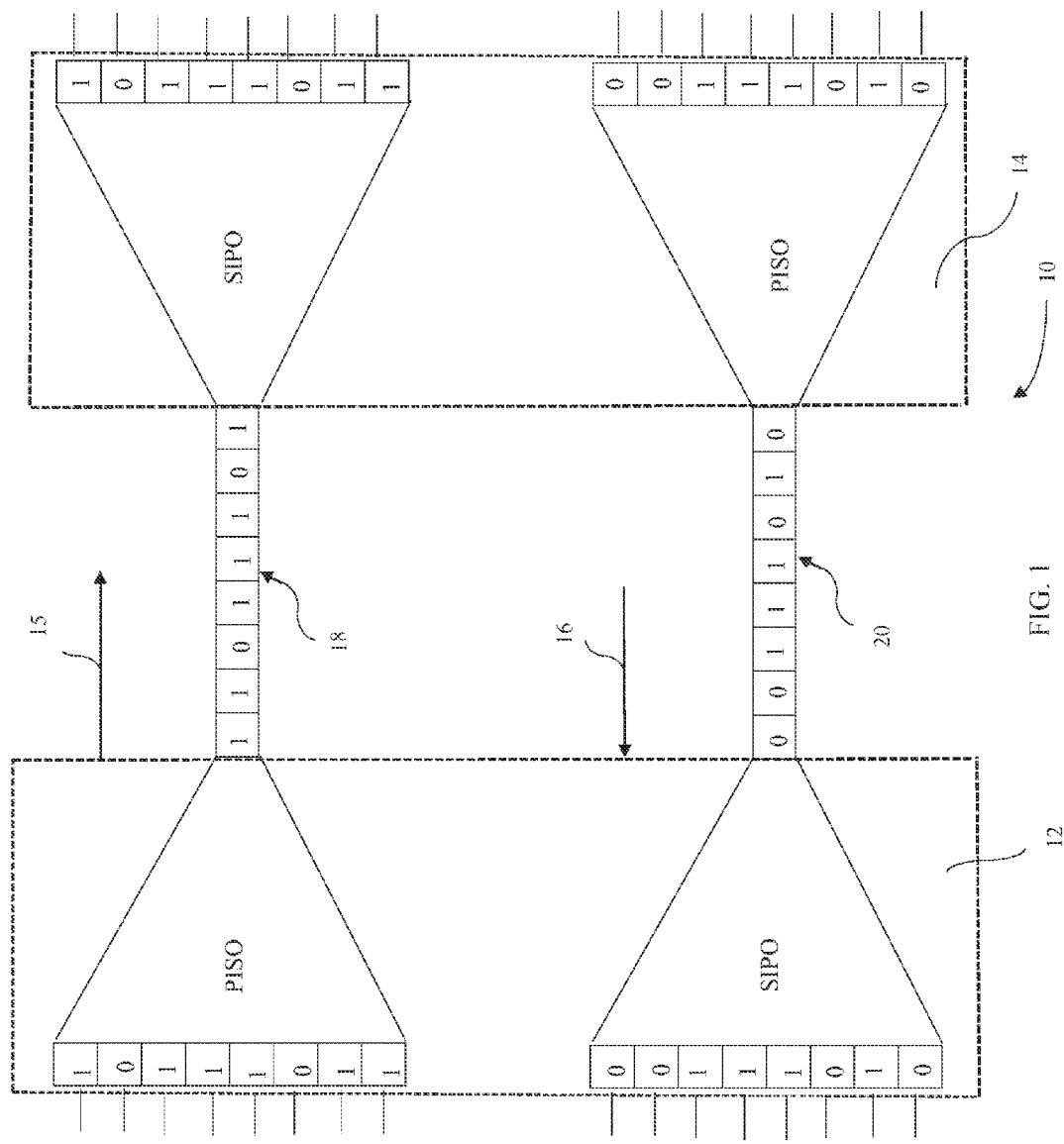
FIG. 1 is a simplified illustration of a pair of SerDes lanes.

While the embodiments disclosed herein are susceptible to various modifications and alternative forms, specific embodiments thereof have been shown by way of example in the drawings and are herein described in detail. It should be understood, however, that it is not intended to limit the invention to the particular form disclosed, but rather, the invention is to cover all modifications, equivalents, and alternatives of embodiments of the invention as defined by the claims. The disclosure is described with reference to the drawings, wherein like reference numbers denote substantially similar elements.

Generally, disclosed herein are improved techniques for communication systems that include SerDes lanes. This is generally achieved by providing error detection and correction functionality in which the errors that are looked for are invalid SerDes lanes rather than simply looking for bit errors. The error detection is provided in the described examples by employing checksums (or other type of hash code) appended to each packet of data and the error correction is provided via parity data (generated by an XOR function) in an additional parity lane. As can be seen, disclosed herein are techniques for SerDes robustification, suitable for applications over a wide range of error tolerance levels.

A Robust SerDes Wrapper Macro (RSWM) is described, which associates one or more SerDes lanes together along with a feedback error handling signal and an additional feed-forward parity lane. The bits within the parity lane are constructed by applying the XOR operation across the bits of the other lane(s). In the case of a single lane, the parity lane is just a copy of the other lane. On the transmit side, the data within each lane is broken up into small packets and appended with a small checksum. On the receive side, the checksum is computed for each packet, and checked against the transmitted checksum. If the checksum fails, the lane is assumed to be dead. The bits for the lost packet are reconstructed by applying the XOR operation across all the bits of the other (not-dead) lanes. The reconstructed bits are output in place of the lost bits. In the case that multiple lanes are dead simultaneously, a packet of all-zeros is output. When a lane is detected to be dead, a dead-lane signal is fed back upstream to the transmitting SerDes macro (as used herein a SerDes macro includes one or more SerDes lanes along with associated control circuitry that typically includes a phase locked loop (PLL) and digital control circuitry). This signal initiates a reset of both the sending and receiving SerDes macros corresponding to the dead lane. The implementation ensures that the dead time is less than 20 us. Additionally, dead lanes may be detected by leveraging a "loss of lock" or other error detection signal output by the SerDes macro. Packet-based error detection has the advantage that it can prevent bad-bits from being output, while a "loss-of-lock" signal might not assert quickly enough to guarantee no bad-bits are output.

One example instantiation of a RSWM for satellite applications includes four to eight SerDes lanes and an additional forward parity lane.

The RSWM can be instantiated such that no lanes are bonded with a parity lane, and each lane operates independently. Even in this case, the error feedback signal ensures that dead lanes are detected and reset within a reasonably short time (e.g., 20 us).

FIG. 1 shows a communications system 10 with a pair of SerDes lanes, one passing communication data in a first direction 15 and the other passing communication data in a second direction 16. The data is passed between a pair of SerDes devices 12 and 14. Each SerDes device 12 and 14 includes a Parallel In, Serial Out (PISO) device that receives parallel data and outputs serial data as well as a Serial In, Parallel Out (SIPO) device that receives serial data and outputs parallel data.

The PISO of the first SerDes device 12, the SIPO of the second SerDes device 14, and a serial communication line 18, constitute the first SerDes lane, which operates in direction 15. The PISO of the second SerDes device 14, the SIPO of the first SerDes device 12, and a serial communication line 20, constitute the second SerDes lane, which operates in direction 16. As can be seen in this simple example, the parallel data received at the PISO of the first SerDes lane is converted to and appears in serial format in the communication line 18, and then is converted by the SIPO into parallel data at the second SerDes device 14. Similarly, the second SerDes lane shows parallel data converted to serial data which appears in the serial communication line 20 and then back to parallel data via the SIPO of the first SerDes device 12.

Figure 2:
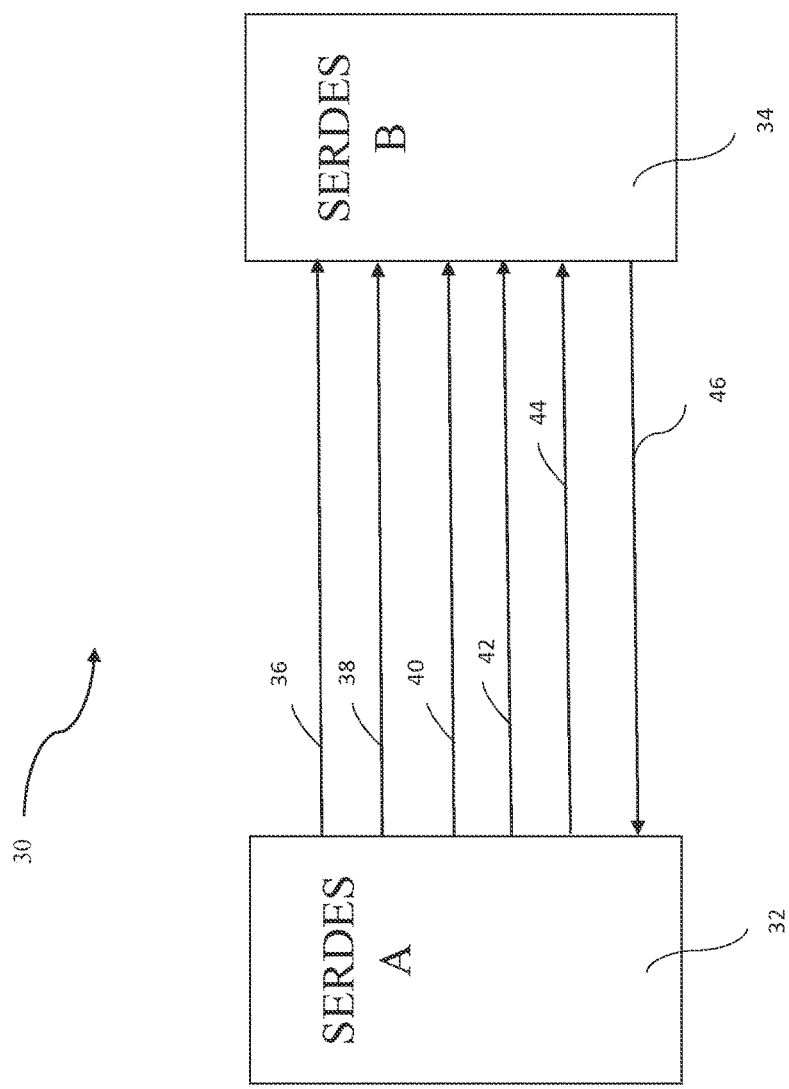
FIG. 2 is a simplified illustration of a group of SerDes lanes along with a parity lane and an upstream communication lane.

FIG. 2 provides less detail about the PISO and SIPO devices in the SerDes devices, but instead shows a multiplicity of SerDes lanes involving the pair of SerDes devices. In this case, four SerDes lanes 36, 38, 40, and 42 are shown providing communication data from SerDes A device 32 to SerDes B device 34. A separate parity lane 44 is also provided from the SerDes A device to the SerDes B device. An upstream communication line 46 is provided for the SerDes B device to communicate with the SerDes A device. The parity lane 44 can provide error correction capability for an associated group of SerDes lanes. In this simple example, all four of the SerDes lanes 36, 38, 40, and 42 can be associated together and information related thereto can be provided on the parity lane 44. Alternatively, a subset of the SerDes lanes, or a greater number of SerDes lanes, could be associated together and have a parity lane with information related thereto provided thereon.

The parity lane 44 may include data on a bit-by-bit basis, where each bit value is related to the Exclusive OR product of the bit value on each of the associated SerDes lanes. For example, if an odd number of the four associated SerDes lanes contain a one in a given bit position, the Exclusive OR product that appears in the parity lane will also be a one. On the other hand, if an even number (which includes zero) of the four associated SerDes lanes contain a one in a given bit position, the Exclusive OR product that appears in the parity lane will be a zero. With this information in the parity lane, any time that the SerDes B device 34 determines that one of the SerDes lanes is invalid, the data in that SerDes lane can be reconstructed from the parity information. More specifically, if the SerDes B device 34 determines that SerDes lane 42 is invalid, and if the value for a given bit in the other three SerDes lanes 36, 38, and 40 is a one in an even number of those bits, then if the parity lane bit information shows a one in that given bit, the SerDes B device 34 can reconstruct the bit information in the SerDes lane 42 to place a one in that bit position. Now, after reconstruction, three of the four SerDes lanes have a one in that bit position, and three is an odd number, so the parity lane correctly has a one in that location.

In addition to correcting the data in an invalid lane, the SerDes B device 34 can send a signal or indication via the communication link 46 back upstream to the SerDes A device 32 to indicate that a particular SerDes lane is in an invalid state. In response, the SerDes A device 32 can perform an operation to reset the invalid SerDes lane. This communication link 46 could be an existing communication link, or it could be an additional communication link.

Figure 3:
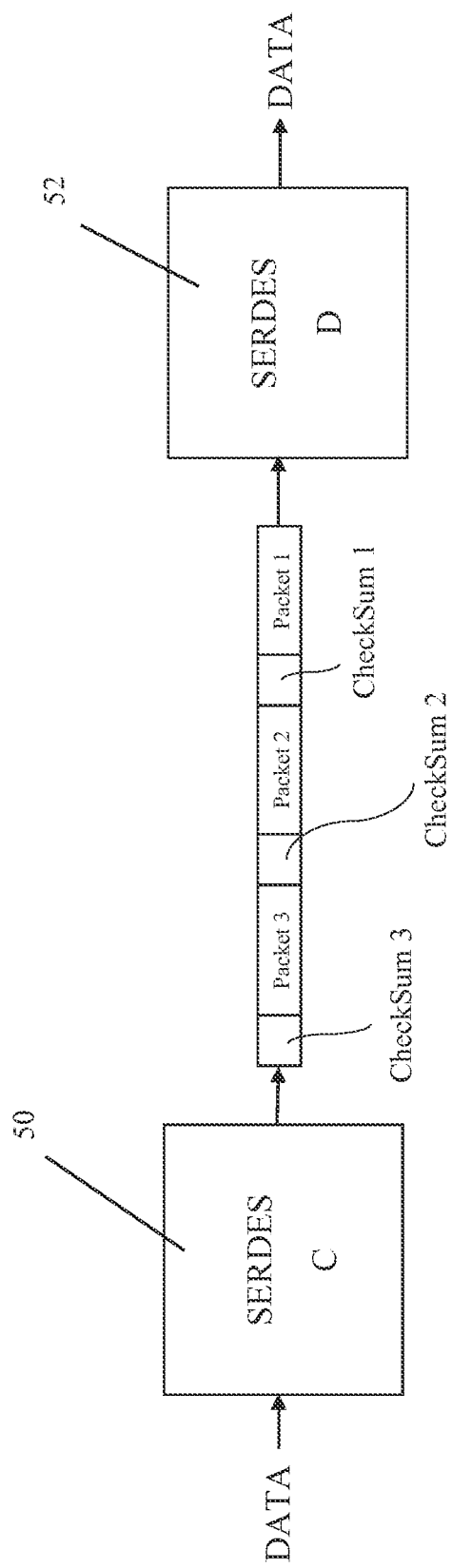
FIG. 3 is a simplified illustration of error detection information inserted into a serial data stream.

FIG. 3 provides further detail about how error detection information is packed into data on a serial communication line in a SerDes lane. In this case, parallel data is received by SerDes C device 50 which converts the parallel data into multiple packets of serial data. Each packet of serial data can be an appropriate size. One approach would be for each packet to be relatively small (e.g., eight bits). Each packet of serial data is followed by a piece of error detection information, such as a hash code. A simple example of an acceptable type of hash code is a checksum. Other examples of types of hash codes include md5sum, sha 1, CRC, and other well-known hash codes. One specific example of a type of hash code is one that includes the Exclusive OR product of the packet of data. In other words, the hash could code be a single bit of data, in which the value of that bit is a 1 if there are an odd number of 1s in the packet of data and the value of that bit is 0 if there are an even number of (or no) 1s in the packet of data.

The packetized serial data is received by the SerDes D device 52 where the received checksum is compared to a checksum independently determined on the packet data by the SerDes D device 52. If the received checksum is different than the independently determined checksum, then the SerDes D device 52 determines that the SerDes lane is invalid.

Figure 4:
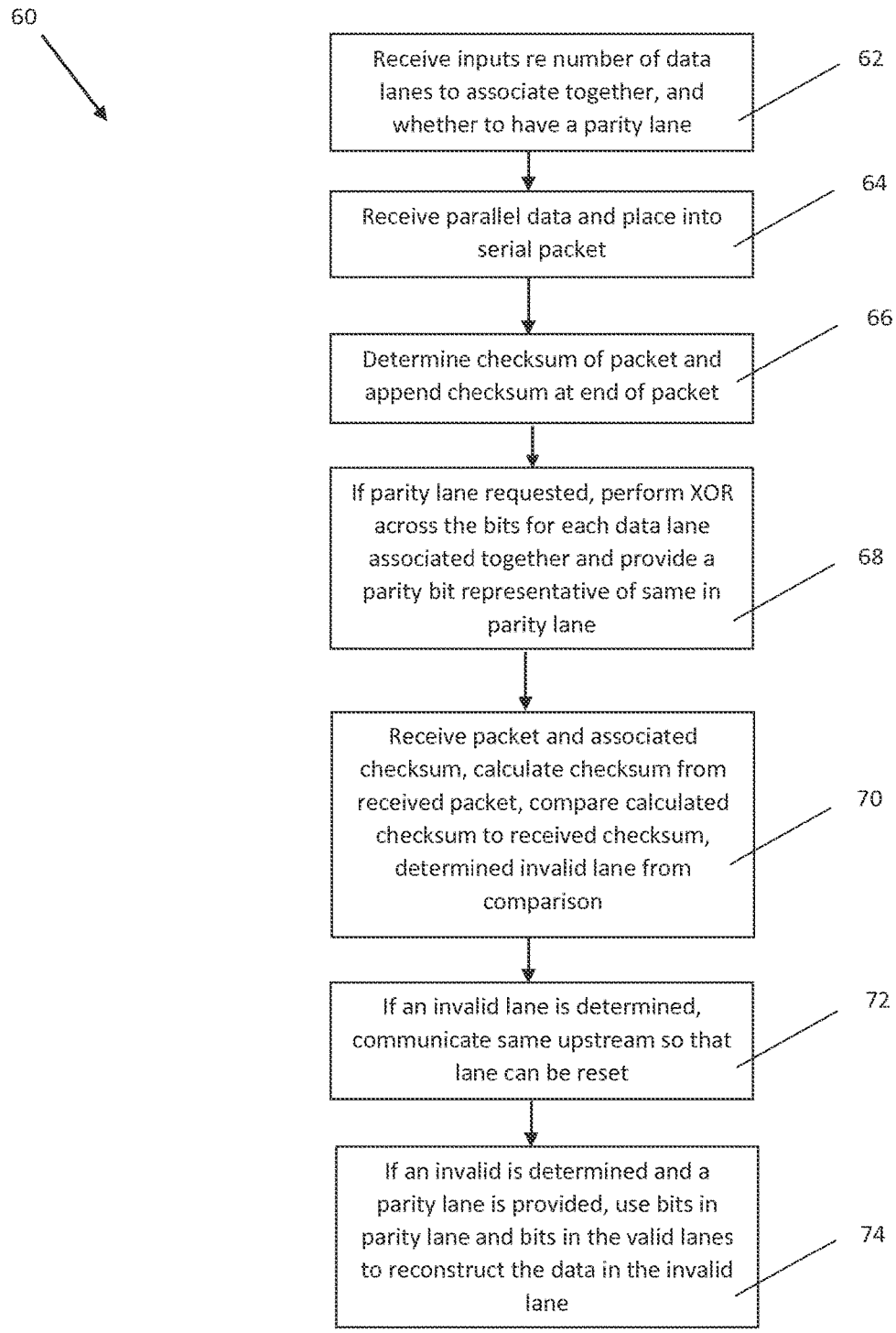
FIG. 4 is a flowchart of an error detection and error correction process taught herein.

FIG. 4 provides further detail about a process 60 for error detection and error correction according to the techniques disclosed herein. First, inputs are received (62) regarding the number of SerDes lanes to associate together and whether to or not to have a parity lane. Next, parallel data is received (64) and placed into serial packets of data. Also, the checksum (or other type of hash code) is determined (66) for each packet of serial data and is appended at the end of the packet. If a parity lane has been requested, an Exclusive OR function is performed (68) across the bits for each SerDes lane associated together and a parity bit representative of the Exclusive OR operation is provided in the parity lane. The packets of serial data and associated checksums are received (70) on the other end of the SerDes lane. The checksum is calculated from the received packet and compared to the received checksum. From this comparison it is determined if the lane is invalid. If an invalid lane is determined, an indication is communicated (72) upstream though so that the invalid SerDes lane can be reset. If an invalid lane is determined and a parity lane has been provided, the bits in the parity lane and the bits in the valid lanes are used (74) to reconstruct the data in the invalid lane.

As can be appreciated, the techniques herein are useful for determining invalid lanes in SerDes lane communication systems. This light-weight parity-lane approach can be preferable to certain existing SerDes protocols that have a certain amount of error detection and correction that merely looks for bit errors, and typically consume more power and real estate. Further, the techniques disclosed herein are advantageous because they can be used in different combinations. For example, via user configurable settings, it is possible that no parity lanes are provided and merely error detection is available. In other arrangements achieved via user configurable settings, parity lanes can be provided and error correction can be provided in addition to error detection.

Conventional SerDes designs are generally carefully optimized to provide robust high speed serial communications while providing such capability with the low impact on power and size in the chips designs that use these SerDes designs. Significant engineering effort is required to design, execute, and test a complex SerDes design, especially in state-of-the-art semiconductor fabrication nodes which presently include 32 nm, 28 nm, and 16 nm feature sizes. A semiconductor circuit that is optimized for use in an ionized radiation environment at the physical design level without significant modification to an existing semiconductor process is often termed to be radiation hardened by design (RHBD). Designing a RHBD SerDes optimized for use in the ionizing radiation environment of space generally requires additional engineering effort beyond that of a SerDes optimized for terrestrial applications. Such a RHBD SerDes is generally expected to consume additional die area and/or electrical power relative to a design intended solely for terrestrial use. The additional die area and power can vary between designs, although each of these parameters can be in the range of 10% to over 100% relative to a design intended for terrestrial use. The additional engineering resources and increase in die size and/or power are of sufficient potential magnitude that the techniques disclosed herein are novel in providing RHBD SerDes functionality optimized for use in the ionizing radiation of space with a smaller magnitude of engineering effort along with less impact on die area and/or power relative to a SerDes design optimized for space.

The naturally present ionizing radiation environment in space can vary as a function of factors including the altitude of the mission orbit, the degree of inclination of the mission orbit, and time variable elements of space weather including solar flares. The degree to which a specific mission can accept intermittent degradation or interruption of the communication capabilities of a SerDes varies to a considerable degree, potentially by multiple orders of magnitude. There is an economic incentive to meet the needs of multiple missions, potentially in a wide range of orbits, with a common SerDes macro design. The techniques disclosed herein are novel in that they provide the ability for the circuit designer to use the SerDes macro as a common design element that can be reconfigured to provide the degree of performance that is needed to meet specific mission requirements without the cost and schedule impact of a new SerDes macro design for each application.

While the embodiments of the invention have been illustrated and described in detail in the drawings and foregoing description, such illustration and description are to be considered as examples and not restrictive in character. For example, certain embodiments described hereinabove may be combinable with other described embodiments and/or arranged in other ways (e.g., process elements may be performed in other sequences). Accordingly, it should be understood that only example embodiments and variants thereof have been shown and described.

I claim:

1. A device, comprising:
    a pair of serializer/deserializers implemented in semiconductor circuitry with a serial communication line therebetween, that together include a SerDes lane; and
    an error detection system associated with the SerDes lane, the error detection system detecting when the SerDes lane is invalid, wherein the error detection system includes determining a hash code of a packet of data in the SerDes lane at a transmit side of the SerDes lane, sending the determined hash code along with the associated packet of data to a receive side of the SerDes lane, calculating a hash code of the received packet of data in the SerDes lane at the receive side of the SerDes lane, and comparing the calculated hash code to the sent hash code and determining the presence or absence of errors based on the comparison;

wherein the device is configurable to allow for a user to optionally select or deselect for the transmit side of the SerDes lane to reset the SerDes lane upon receiving a communication from the receive side of the SerDes lane that the SerDes lane is invalid.

2. A device as defined in claim 1, wherein the error detection system receives an input from a loss-of-lock indicator provided by the SerDes lane and uses that indicator to help determined when the SerDes lane is invalid.

3. A device as defined in claim 1, wherein the error detection system is configurable to allow for a user to optionally select or deselect a parity lane to be associated with one or more SerDes lanes, in order to provide parity information from which data in a SerDes lane determined to be invalid can be reconstructed.

4. A device as defined in claim 1, wherein the device is configurable to allow for a user to optionally select or deselect for the error detection system to be operational.

5. A device as defined in claim 1, wherein the device is configurable to allow for a user to optionally select or deselect for a determination that the SerDes lane is invalid to be communicated from the receive side of the SerDes lane to the transmit side of the SerDes lane.

6. A device as defined in claim 1, further including an error correction system associated with the SerDes lane to reconstruct data in the SerDes lane when it is determined that the SerDes lane is invalid.

7. A device as defined in claim 6, wherein the error correction system includes a parity lane associated with one or more SerDes lanes, the parity lane including parity information based on the Exclusive OR state of the bits in the one or more SerDes lanes.

8. A device as defined in claim 7, wherein the parity information is used to reconstruct bits in a SerDes lane that has been determined to be invalid.

9. A device as defined in claim 1, further including a communication link to provide information about the invalid SerDes lane from the receive side to the transmit side.

10. A device as defined in claim 1, wherein the determined hash code and the calculated hash code each include the Exclusive OR product of the packet of data.

11. A device resident in a communications satellite, comprising:
a pair of serializer/deserializers implemented in semiconductor circuitry with a serial communication line therebetween, that together include a SerDes lane in the communications satellite; and
an error detection system in the communications satellite, the error detection system associated with the SerDes lane, the error detection system detecting when the SerDes lane is invalid, wherein the error detection system includes determining a hash code of a packet of data in the SerDes lane at a transmit side of the SerDes lane, sending the determined hash code along with the associated packet of data to a receive side of the SerDes lane, calculating a hash code of the received packet of data in the SerDes lane at the receive side of the SerDes lane, and comparing the calculated hash code to the sent hash code and determining the presence or absence of errors based on the comparison;
wherein the device is configurable to allow for a user to optionally select or deselect for a determination that the SerDes lane is invalid to be communicated from the receive side of the SerDes lane to the transmit side of the SerDes lane.

12. A device as defined in claim 11, wherein the error detection system receives an input from a loss-of-lock indicator provided by the SerDes lane and uses that indicator to help determined when the SerDes lane is invalid.

13. A device as defined in claim 11, wherein the error detection system is configurable to allow for a user to optionally select or deselect a parity lane to be associated with one or more SerDes lanes, in order to provide parity information from which data in a SerDes lane determined to be invalid can be reconstructed.

14. A device as defined in claim 11, wherein the device is configurable to allow for a user to optionally select or deselect for the error detection system to be operational.

15. A device as defined in claim 11, wherein the device is configurable to allow for a user to optionally select or deselect for the transmit side of the SerDes lane to reset the SerDes lane upon receiving a communication from the receive side of the SerDes lane that the SerDes lane is invalid.

16. A device as defined in claim 11, further including an error correction system in the communications satellite, the error correction system associated with the SerDes lane to reconstruct data in the SerDes lane when it is determined that the SerDes lane is invalid.

17. A device as defined in claim 16, wherein the error correction system includes a parity lane associated with one or more SerDes lanes, the parity lane including parity information based on the Exclusive OR state of the bits in the one or more SerDes lanes.

18. A device as defined in claim 17 wherein the parity information is used to reconstruct bits in a SerDes lane that has been determined to be invalid.

19. A device as defined in claim 11, further including a communication link to provide information about the invalid SerDes lane from the receive side to the transmit side.

20. A device as defined in claim 11, wherein the determined hash code and the calculated hash code each include the Exclusive OR product of the packet of data.

21. A device, comprising:
a pair of serializer/deserializers with a serial communication line therebetween, that together include a SerDes lane; and
an error detection system associated with the SerDes lane, the error detection system detecting when the SerDes lane is invalid, wherein the error detection system includes determining a hash code of a packet of data in the SerDes lane at a transmit side of the SerDes lane, sending the determined hash code along with the associated packet of data to a receive side of the SerDes lane, calculating a hash code of the received packet of data in the SerDes lane at the receive side of the SerDes lane, and comparing the calculated hash code to the sent hash code and determining the presence or absence of errors based on the comparison;
an error correction system associated with the SerDes lane to reconstruct data in the SerDes lane when it is determined that the SerDes lane is invalid, wherein the error correction system includes a parity lane associated with one or more SerDes lanes, the parity lane including parity information based on the Exclusive OR state of the bits in the one or more SerDes lanes, wherein the parity information is used to reconstruct bits in a SerDes lane that has been determined to be invalid;

wherein the device is configurable to allow for a user to optionally select or deselect for a determination that the SerDes lane is invalid to be communicated from the receive side of the SerDes lane to the transmit side of the SerDes lane and for the transmit side of the SerDes lane to reset the SerDes lane upon receiving a communication from the receive side of the SerDes lane that the SerDes lane is invalid.

* * * * *